United States Patent [19]

Hawkins et al.

[11] 4,388,145

[45] Jun. 14, 1983

[54] LASER ANNEALING FOR GROWTH OF SINGLE CRYSTAL SEMICONDUCTOR AREAS

[75] Inventors: William G. Hawkins; Jerry G. Black, both of West Webster, N.Y.

[73] Assignee: Xerox Corporation, Stamford, Conn.

[21] Appl. No.: 316,210

[22] Filed: Oct. 29, 1981

[51] Int. Cl.³ .............................................. C30B 13/06
[52] U.S. Cl. ......................... 156/617 R; 156/DIG. 88
[58] Field of Search ................ 156/620, 624, 607, 617, 156/DIG. 80, DIG. 88; 148/1.5, 171, 174; 75/652 M

[56] References Cited

U.S. PATENT DOCUMENTS 3,585,088  6/1971  Schwuttke et al. ......... 156/DIG. 80
4,174,422 11/1979  Mathews et al. ................... 156/610
4,330,363  5/1982  Biegesen et al. .................... 156/620

Primary Examiner—Hiram H. Bernstein
Attorney, Agent, or Firm—Serge Abend

[57] ABSTRACT

A method for laser induced conversion of large predefined areas of amorphous or polycrystalline semiconductor material, upon a substrate, into single crystal areas by using an infrared laser energy source to cause the bulk of heating to occur in the substrate and not in the predefined areas so that the areas are heated to melting by the substrate. The substrate comprises a material which is highly absorptive of the laser wavelength and the predefined areas comprise a material substantially transparent to laser wavelength, and the substrate and areas have different refractive indexes.

11 Claims, 6 Drawing Figures

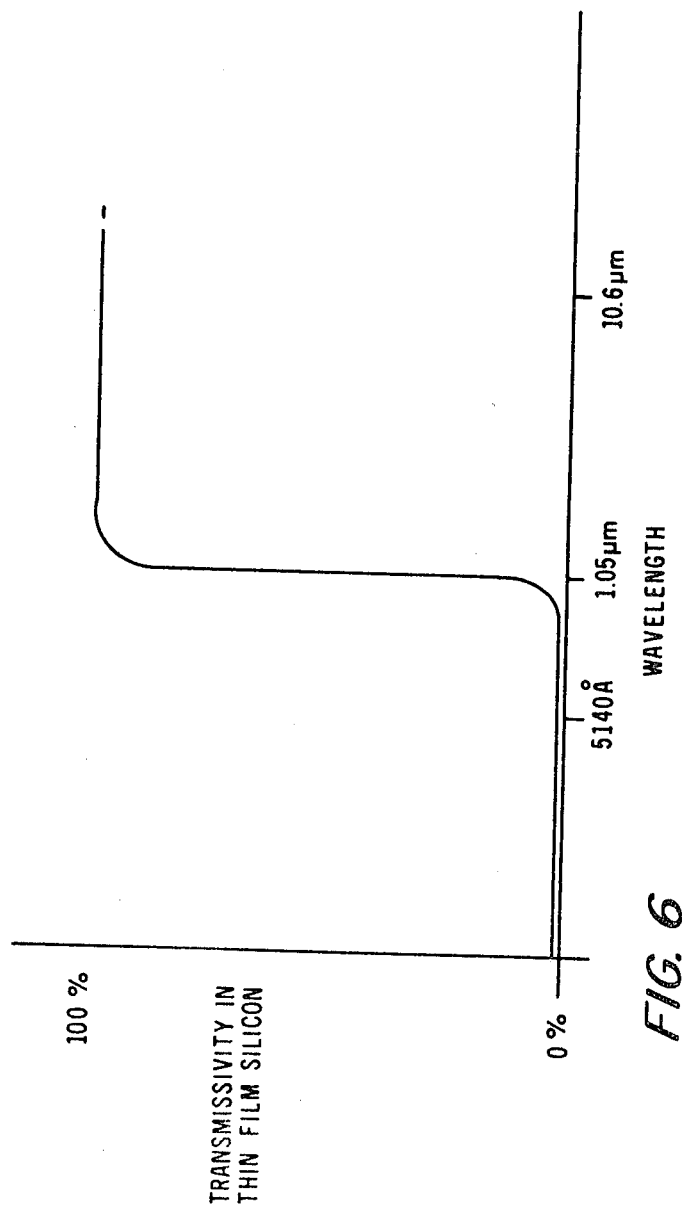

LASER ANNEALING FOR GROWTH OF SINGLE CRYSTAL SEMICONDUCTOR AREAS

This invention relates to a method for laser induced conversion of electronic device size predefined areas of amorphous or polycrystalline semiconductor material, upon a substrate, into large single crystal areas and, more particularly, to a method for using an infrared laser energy source to cause the bulk of heating to occur in the substrate and not in the predefined areas.

There is currently a great deal of technical interest in methods for producing an array of large single crystal areas of semiconductor material, such as silicon, on amorphous insulators such as quartz or glass. Realization of a practical process for making crystalline silicon in known predetermined locations on insulators is expected to result in dramatic cost reductions in cases where distributed circuits are required, such as flat panel display drivers. An economically viable scheme for production of crystalline silicon on insulators must have the capability of routinely producing the desired material at high yield. In addition to reliably and reproducibly making the single crystal semiconductor material, a further designed result is the production of the single crystal material in a beneficial crystal orientation, since it is well known that favorably oriented electrical device size silicon crystals will allow subsequent fabrication of high quality electronic devices on fused silica.

Several methods for the production of crystalline silicon on insulators have been proposed in the literature. For example, recrystallization of amorphous or polycrystalline silicon islands by way of argon (Ar+) laser energy absorption is the subject of copending U.S. patent application, Ser. No. 182,195 filed on Aug. 28, 1980 now U.S. Pat. No. 4,330,363 in the name of Biegelsen et al, by the same assignee as the instant invention. In this Ar+ laser induced recrystallization process, the target for the laser was an amorphous substrate bearing polycrystalline islands and patterned surface features. The patterned surface features which surrounded the islands or were otherwise actively associated with the island periphery during the heating and cooling process, were identified as thermal control elements. During laser irradiation of the islands and their support, the islands were heated by the visible light source and the thermal control elements were used to suppress the rate of cooling of the laser heated silicon islands at the island edges. The resultant differential thermal gradient between the central portion of each island and its edges greatly improved island crystallinity by causing crystallization to occur from a single nucleation location and suppressing competitive nucleation locations at the island edges.

Another known recrystallization method described in the literature is the graphite strip blackbody heating of a quartz substrate with a silicon film supported thereon. As taught by Geis et al in Applied Physics Letters 37, 454 (1980), a pair of graphite heaters is used. One graphite heater brings the substrate to a temperature slightly below the melting point of the silicon and the other graphite heater is scanned over the top of the substrate and supplies energy to heat the silicon film to its melting point. The resultant recrystallized film consist of millimeter size grains separated by low angle grain boundaries; the crystals having a (100) orientation parallel to the bulk fused silica substrate. While these results are interesting, the commercial utility of the adventitiously oriented large area single crystals lying in the film, is severely limited because the large area single crystals are not disposed in predetermined useful locations in the film and random microcracking is present throughout the film. The microcracking is a consequence of the thermal mismatch between silicon and fused silica, which produces large tensile stresses in the silicon film. Another disadvantage of strip heater recrystallization is that it is a high temperature process, wherein the entire substrate is heated in excess of 1000° C., unlike Ar+ laser annealing wherein only the top surface and a very shallow depth of the substrate are heated. Low temperature processing is usually preferred in device processing.

In addition to the work done by Biegelsen et al, Ar+ laser annealing has been by far the most common annealing laser for the application being described herein, namely, the recrystallization of amorphous or polycrystalline semiconductor on an amorphous substrate, since the visible Ar+ laser light is efficiently absorbed by and heats the silicon to melting. When a quartz or fused silica substrate is used, as is generally the case, the Ar+ laser is not capable of heating it as it is effectively transparent to that wavelength. Thus, since absorption of laser light by the islands and subsequent diffusion of the heat outward and downward, into the cooler substrate, acts to produce a temperature profile across the island that would be lower at the edges and higher at the center, Biegelsen et al have incorporated various configurations of thermal control structures to achieve their desired goal of single crystal formation. Although this particular laser is presently preferred for recrystallization annealing its efficiency (0.06%) limits power levels of commercial models to less than 25 watts.

Therefore, it should be understood that it is highly desirable to obtain large area single crystals of semiconductor material at predetermined locations, for use in electronic devices. To achieve that end, an improvement in the method of laser recrystallization of arrays of large area amorphous or polycrystalline semiconductor islands on an amorphous substrate would be advantageous. As laser annealing presently appears to be a successful method, we have sought to improve the current state-of-the-art of laser annealing by providing a more efficient, substantially higher power laser which can be scanned at a faster rate than has heretofore been possible with other lasers, over a single row of islands or over several island rows simultaneously and which will enable simplification of island patterning for producing the desired thermal profile across each semiconductor island to yield large area single crystals. In so doing we have also achieved, under some conditions, controlled crystal orientation.

Our novel method includes the steps of providing a supporting substrate in the form of a material being highly absorptive of the wavelength of a projected optical energy source; providing an array of crystallizable semiconductor islands upon the substrate, the islands being in the form of a material subtantially transparent to the wavelength of the projected optical energy source and having a different refractive index than the substrate; projecting an optical energy source upon each semiconductor island and a portion of the substrate surrounding each island; and reflecting more incident optical energy in the region of the substrate directly beneath the islands than in the region of the substrate surrounding the islands for causing a controlled heating of the substrate by the optical energy source, such that the region of the substrate surrounding the islands is made hotter than the region of the substrate directly beneath the islands, while leaving the islands substantially unheated thereby. Once the substrate is heated, removing the optical energy source, and melting the islands by heating them from the heated substrate; and finally cooling the melted islands and the substrate such that during cooling a concave thermal gradient exists across each island with the center of each island being cooler than its edges so that each island recrystallizes as a single crystal.

Many of the attendant advantages and the mode of operation of this invention will become more readily appreciated as the same becomes better understood by reference to the following detailed description when considered in connection with the accompanying drawings wherein:

FIG. 6 is a graphical representation of the transmissivity spectrum of a thin layer of silicon.

Figure 1:
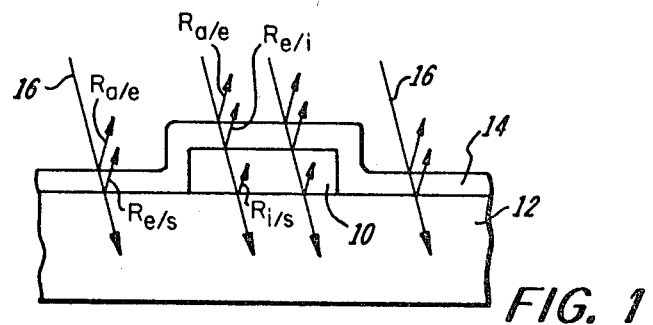
FIG. 1 is a side sectional view showing an encapsulated semiconductor island upon a substrate with light traces representative of a suitable laser beam.

Turning to FIG. 1, it is diagrammatically illustrated that our invention relates to providing islands 10 of semiconductor material, in an amorphous or polycrystalline form, upon a bulk support material 12 and then irradiating the island and its support with sufficient optical energy to convert the entire island to a single crystal of the semiconductor. Preferably, the island will also have a desired crystal orientation. During the conversion step, the semiconductor island passes through the molten state, prior to achieving its single crystal state. In order to confine the molten material, which has a tendency to bead or ball up in the molten state, we may provide an encapsulating layer 14. We have selected as our irradiating laser an optical energy source represented by ray traces 16 to whose wavelength the islands will be highly transmissive, i.e. they will absorb little or none of its optical energy and to whose wavelength the substrate will have opposite characteristics, namely, it will be highly absorptive. Additionally, when selecting the island and substrate materials it is important that their refractive indexes (n) be different, as will be described. By selecting this set of system parameters we insure that the island will not be heated to its molten state by absorption of the irradiated optical energy but rather that the substrate will absorb a substantial amount of the optical energy and will in turn heat the island to melting in the desired preferential manner to be described below.

Figure 2:
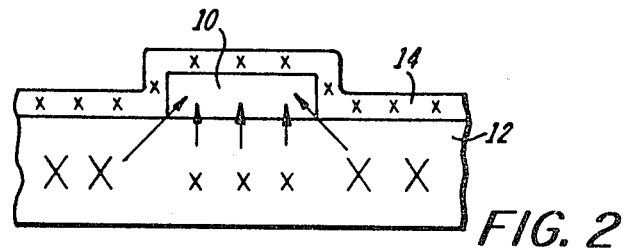
FIG. 2 is a side sectional view similar to that of FIG. 1 showing the relative heat absorption in the composite layers and the relative heat flow to the island.

As illustrated in FIG. 2, a portion of the optical energy, as represented by ray traces 16, will be reflected at each interface in the system. Thus, there will be some reflection at the air/encapsulant ($R_{a/e}$) over the entire system. Looking specifically at the zone surrounding the island 10, there may be some further reflection of the partially transmitted light at the encapsulant/substrate interface ($R_{e/s}$) if the encapsulant and substrate are made of materials having different refractive indexes. The remaining transmitted light will be absorbed into and thereby heat the substrate. Now looking specifically at the region directly over the island 10, a portion of the light transmitted through the encapsulant layer 14 will be reflected at the encapsulant/island interface ($R_{e/i}$) and, of the remaining light transmitted through the island, another portion will be reflected at the island/substrate ($R_{i/s}$) interface. The remaining light transmitted to the substrate, will be absorbed thereby.

As a first approximation, the proportion of light reflected (R) from each interface is the square of the difference between the reflective indexes (n) divided by their sum, as represented by the following equation:

$$\text{i.e., } R = \left(\frac{n_2 - n_1}{n_2 + n_1}\right)^2$$

Thus, by applying this equation, it can be seen that by selecting an island semiconductor material having substantially different refractive indexes, the serial reflections through the plural interfaces will result in a greater optical energy transmission to the substrate region surrounding the island than to the substrate region directly below the island. Consequently, the zone directly under the island will be cooler than the outboard zone. This condition is illustrated in FIG. 2 wherein the Xes indicate heating caused by optical energy absorption, and their relative size is an indication of the temperature intensity. It will be noted that there is some heating shown in the encapsulating layer; this situation will only occur if the encapsulating layer is made of a material absorptive of the optical energy wavelength and is thick enough to absorb the optical energy.

Figure 5:
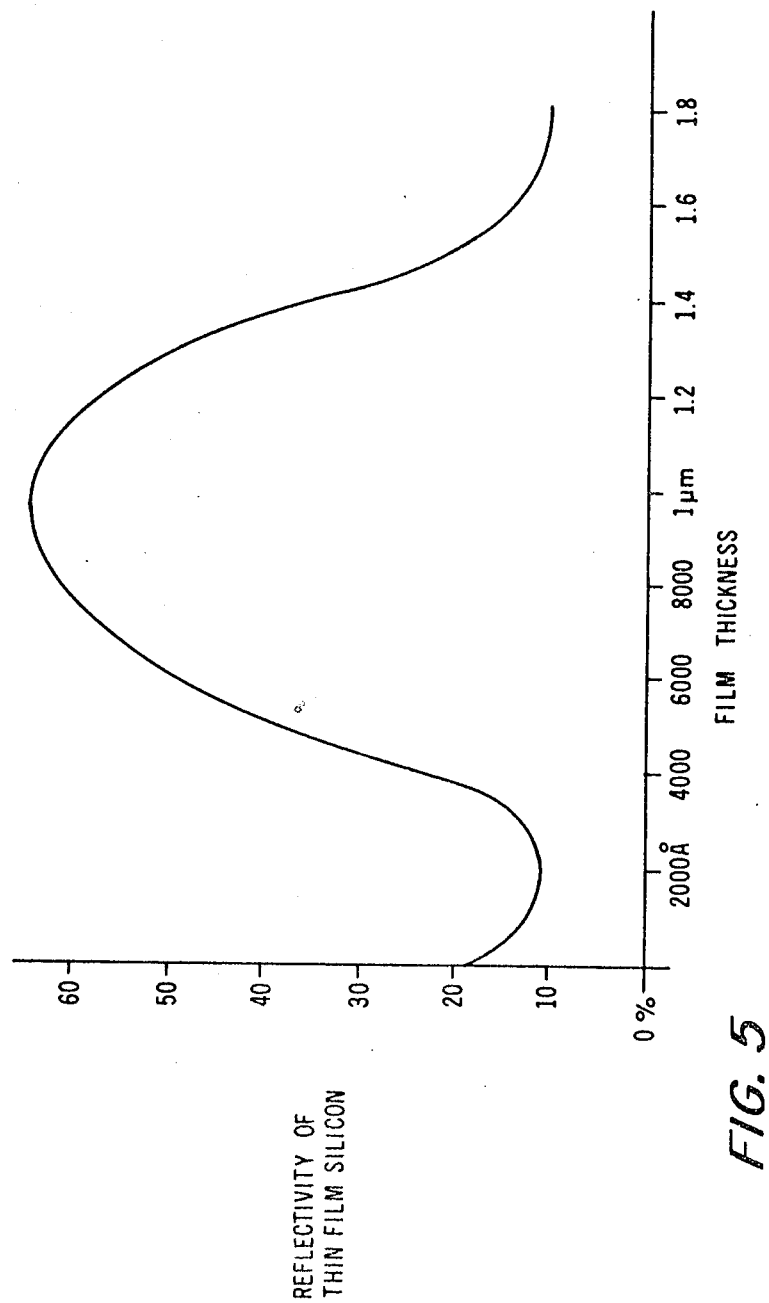
FIG. 5 is a graphical representation of the reflectivity of a thin silicon layer as a function of the layer thickness.

With reference to the graph of FIG. 5, it can be seen that for thin islands, where the interface surfaces are close to one another, the reflectivity of the silicon island will be a function of its thickness. Thus, while the equation above is basically correct, a thin film effect establishes internal reflections from top and bottom film interfaces, which results in a maximum reflection when the film thickness is one quarter ($\frac{1}{4}$) of the incident wavelength. As shown on the graph, the reflectivity of a silicon layer having a thickness of about 9000 Å is about 65%. Such a high reflectivity will result in very little optical energy being transmitted to the substrate beneath the island, causing the island to be very cool at its center and very hot at its edges, i.e. an extremely deep concave thermal profile across the island. Given a thermal profile with such disparite temperatures, high thermal stresses are likely to be present resulting in microcracking of the island. Since it has been found that single crystal formation will occur with the island edges heated to about 100° C. to 200° C. above the center, a shallow concave profile is seen to be more desirable. By adjusting the thickness of the island, a lower reflectivity may be achieved, as for example about 10% at a silicon layer thickness of 2000 Å. Thus, more optical energy will reach the substrate to heat it and the difference in temperature between the island center and the island edges can be tailored to encourage single crystal growth without creating an undesirably large temperature gradient across the island.

If, on the other hand, it has been determined that an island thickness is required which will yield a high reflectivity, it is still possible, by other means, to tailor a shallow concave thermal profile across the island. By using a thick, absorptive encapsulant layer, the encapsulant layer will be uniformly heated. The highly reflective island will cause a deeply concave temperature profile across the substrate directly beneath the island. The resultant thermal profile across the island, which will be heated by both the uniformly heated encapsulant layer and the non-uniformly heated substrate, will be relatively shallow.

Figure 3:
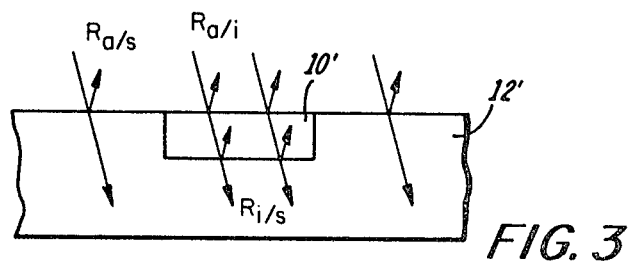
FIG. 3 is a side sectional view showing another form of island structure upon a substrate.
Figure 4:
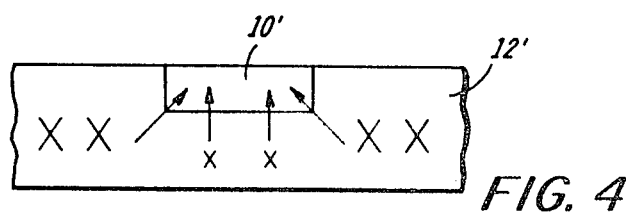
FIG. 4 is a side sectional view similar to that of FIG. 3 showing relative heat absorption.

In FIGS. 3 and 4 the encapsulating layer has been eliminated. Since the purpose of the encapsulating layer is merely to confine the island material when in its molten state, an alternative confinement arrangement is shown in these drawings. The island 10' is deposited in a trough formed in the substrate 12' by etching, micromachining or other conventional technique. An annealing laser may be scanned over the material to be recrystallized in a manner similar to that described above with respect to FIGS. 1 and 2 and, having selected materials with relative refractive indexes as previously set forth, a similar optical transmission and heating pattern will be established in the substrate.

We have used a $CO_2$ laser to recrystallize silicon on bulk fused silica ($SiO_2$). This laser is substantially (400×) more efficient than the commonly used $Ar^+$ laser and is of greater intensity, allowing much faster scan speeds and larger spot sizes than the $Ar^{30}$. In addition to being a very efficient laser system, the $CO_2$ laser output couples into the bulk fused silica in a unique manner which, we believe, is particularly suited for growth of single crystal silicon islands. In comparison to the state-of-the-art $Ar^{30}$ laser, which transmits in the visible wavelength (5145 A), the $CO_2$ laser is an infrared energy source having a wavelength of 10.6 $\mu$m. As can be observed in FIG. 6, the percentage of transmission of light through silicon goes sharply from 0%, for wavelengths shorter than 1.05 $\mu$m, to 100%, for wavelengths longer than 1.05 $\mu$m (for the thicknesses of silicon of interest to us), and drops off sharply at longer wavelengths in the region indicated by the dashed-line trace. This ignores, of course, the effects of surface reflectivity and optical interference, which have been discussed above and are taken into account in FIG. 5. There is substantially no transmission of the $Ar^+$ laser optical energy in the silicon island, thus it can be said to absorb the $Ar^+$ wavelength. On the other hand, the silicon island is highly transmissive of the $CO_2$ laser optical energy, therefore it is not absorptive thereof. Conversely, the bulk fused silica absorbs the $CO_2$ laser wavelength and is heated thereby, and does not absorb the $Ar^+$ laser wavelength.

In the configuration of FIGS. 1 and 2, we have used an encapsulating layer 14 of silicon nitride ($Si_3N_4$) having a refractive index of 2 or silicon dioxide ($SiO_2$) having a refractive index of 1.5. When silicon nitride is used, about 87% of the incident energy enters the fused silica substrate in the zone surrounding the islands and is absorbed thereby, while only about 70% enters the fused silica substrate under the silicon islands, having a refractive index of 3.4. The remainder of the incident laser light is reflected from the various interfaces as described above. As a result of the optical energy absorption, the substrate is heated. It, in turn, heats the unheated silicon island to melting (1400° C.). In fact, the silicon island acts as a heat sink, as illustrated by the arrows in FIGS. 2 and 4 which represent the direction and relative intensity of heat flow from the substrate to the island. It can be observed that more heat flows into the islands at their edges than from directly beneath, because the substrate, in that zone, is hotter. Viewed another way, the island, once brought to melting temperature by the hotter substrate, cools more rapidly to the less hot substrate directly beneath it than to the more hot surrounding zone of the substrate. A concave temperature profile exists across the island during cooling from its molten state, such that it will have a coolor center and warmer edges. As set forth by Biegelsen et al, in their copending application referenced above, the hotter island edges during cooling provide the beneficial result of suppressing competing nucleation sites and allowing large area single crystal islands to be formed. However, it should be borne in mind that our method is much simpler than that taught by Biegelsen et al, since it is not necessary to incorporate additional thermal control elements.

We conducted experiments on samples prepared on three inch wafers of G.E. 124 glass which were 400 $\mu$m thick. A 6000 Å layer of LPCVD (low pressure chemical vapor deposition) polysilicon was deposited at 625° C. and subsequently patterned by photolithography and plasma etching in $CF_4$ as hexagonally shaped islands 25 $\mu$m wide by 75 $\mu$m long. The substrates and island patterns were then encapsulated with 400 Å of LPCVD $Si_3N_4$. The laser annealing apparatus consisted of a Leitz microscope with an x-y translation stage. The substrate could be translated and rotated to align rows of islands on the substrate with the scan of a position sensing galvanometer. The output of a 60 watt $CO_2$ laser was passed through a 3x expanding telescope before impinging on a 12.5 cm focal length lens focused on the substrate to a circular spot of approximately 50 $\mu$m diameter. After laser annealing, the $Si_3N_4$ was removed by etching in 180° C. $H_3PO_4$.

A fairly wide range of $CO_2$ laser power will melt the silicon islands without damaging the fused silica substrate. We have found that once laser power is increased until the entire island has melted, another 25% increase in power is necessary before the fused silica is damaged. This has allowed us to use substantial power and to recrystallize rows of islands with scans of more than 3 cm long. The power required to recrystallize silicon islands has been found to increase linearly from 1.3 watts at 1.5 cm/sec. to 3.2 watts at 16.4 cm/sec. In fact, we have successfully recrystallized at scan speeds as high as 20 cm/sec.

In addition to the formation of single crystals, an unexpected and highly beneficial result is achieved at slow scan speeds of less than approximately 0.5 cm/sec for the 50 $\mu$m diameter laser spot. The silicon islands have been observed to consistently crystallize in the orientation of the (100) plane parallel to the substrate and in a <100> orientation along the scan direction, as well. At higher scan speeds the crystals have a random orientation. The thus oriented single crystal silicon has enhanced device electrical properties because it has minimum surface state density and tends to result in a higher conductivity device for a given island. It should be apparent that by using a readily available, more powerful $CO_2$ laser focussed to a larger spot size, a larger area may be scanned, and as each island will be exposed to the laser energy for a longer portion of the scan, faster scanning is made possible. For example, a focussed 500 $\mu$m diameter $CO_2$ laser spot may be scanned at 5 cm/sec to achieve the (100) orientation. This is so because the threshold for the (100) orientation recrystallization behavior depends upon the dwell time of the laser upon the island and its substrate.

We believe that we will be able to successfully draw (100) oriented single crystal silicon stripes at production speeds by an adaptation of the present recrystallization method. By starting with a silicon stripe (island with a high length to width aspect ratio) it is possible to initiate (100) oriented crystallization at one end by passing the $CO_2$ laser over it at a slow scan speed, thereby forming a (100) crystal seed. Then, by increasing the scan rate to production speeds over the remainder of the island, the (100) oriented crystal should be "drawn" over the entire length of the stripe.

Other semiconductor materials which are substantially non-absorptive in the infrared region of the $CO_2$ laser are germanium, gallium arsenide, indium phosphide and cadmium selenide. Therefore, by coupling each with a suitable substrate, similar single crystal island recrystallization results are expected. The important criteria, in selecting materials for practicing this method, are that the island and the substrate have different refractive indexes to result in a significant dip in temperature at the island center, due to the reflectivity gradient. It is also important that the island thickness be adjusted to cause the additional reflection, related to thin film layer thickness, to be low. Additionally, the island should be substantially transparent to the selected laser wavelength light while the substrate should be highly absorptive thereof. Under such conditions, the island will not be heated by the optical energy but the substrate will be. We believe, however, that if as much as about 10%–30% of the laser energy were absorbed in the island on its way through to the substrate the operation of the disclosed method could still be satisfactory since the bulk of the island heating will come from the substrate in the directional manner illustrated in FIGS. 2 and 4 and the center of the island will cool more slowly than the edges.

It should be understood that the present disclosure has been made only by way of example, and that changes in materials and the combination and arrangement of parts may be resorted to without departing from the true spirit and scope of the invention as hereinafter claimed.

What is claimed is:

1. A method for converting predefined areas of semiconductor material into single crystal areas, characterized by including the steps of:
providing support means in the form of a material being highly absorptive of the wavelength of a projected optical energy source and having a first refractive index;
providing an array of crystallizable semiconductor areas upon said support means, said areas being in the form of a material subtantially transparent to the wavelength of a projected optical energy source and having a second refractive index;
projecting an optical energy source upon each semiconductor area and a portion of the support surrounding each area;
reflecting more incident optical energy in the region of said substrate directly beneath said areas than in the region of said substrate surrounding said areas;
heating the substrate with said optical energy source, such that the region of said substrate surrounding said areas is made hotter than the region of said substrate directly beneath said areas, while leaving said areas substantially unheated thereby;
removing said optical energy source;
melting said areas by heating them from said heated substrate; and
cooling said melted areas and said substrate such that during cooling a concave thermal gradient exists across said areas with the center of each of said areas being cooler than its edges and said areas recrystallize as single crystals.

2. The method of claim 1 characterized in that said first refractive index and said second refractive index are different from one another by at least a factor of two.

3. The method of claim 1 characterized by further including the step of confining said areas to maintain the shape of said areas when in their molten state.

4. The method of claim 3 characterized in that said step of confining is carried out by providing an encapsulating layer over said areas and a portion of said substrate.

5. The method of claim 4 characterized in that said encapsulating layer comprises $SiO_2$ or $Si_3N_4$.

6. The method of claim 3 characterized in that said step of confining is carried out by providing cavities in said substrate for receiving said semiconductor areas.

7. The method of claim 1 characterized by projecting a laser spot and imparting relative motion between said spot and said array of areas.

8. The method of claim 1 or claim 7 characterized by projecting a laser spot onto to said areas for predetermined time for producing (100) oriented single crystal areas and that said (100) plane is parallel to said substrate.

9. The method of claim 7 characterized by projecting said laser spot onto to said areas for a predetermined time for producing <100> oriented single crystal areas and that said <100> plane is in the direction of relative motion.

10. The method of claim 1, claim 7 or claim 8 characterized in that said projected optical energy source is a $CO_2$ laser.

11. The method of claim 10 characterized in that said semiconductor areas are islands of silicon and said substrate is $SiO_2$.

* * * * *